United States Patent [19]
Todd et al.

[11] Patent Number: 5,914,534
[45] Date of Patent: Jun. 22, 1999

[54] THREE-DIMENSIONAL MULTI-LAYER MOLDED ELECTRONIC DEVICE AND METHOD FOR MANUFACTURING SAME

[75] Inventors: Michael George Todd, South Lyon; Peter Joseph Sinkunas, Canton; Andrew Zachary Glovatsky, Ypsilanti, all of Mich.

[73] Assignee: Ford Motor Company, Dearborn, Mich.

[21] Appl. No.: 08/642,722

[22] Filed: May 3, 1996

[51] Int. Cl.$^6$ .......................... H01L 21/44; H01L 23/16; H01L 23/02; H01L 29/44
[52] U.S. Cl. .......................... 257/773; 257/774; 257/797; 257/723; 257/730; 257/758; 257/700; 257/686; 438/613; 438/612; 438/614; 438/977; 156/657.1
[58] Field of Search ..................... 257/773, 774, 257/786, 730, 758, 690, 700, 701, 797, 723, 686; 29/830, 852, 846, 848; 174/261–265, 250, 255; 156/150, 657.1; 438/23, 66–68, 107, 110, 109, 613, 612, 614, 977; 361/795

[56] References Cited

U.S. PATENT DOCUMENTS

| | | | |
|---|---|---|---|
| 3,795,047 | 3/1974 | Abolafia et al. | 29/625 |
| 4,499,655 | 2/1985 | Anthony | 257/774 |
| 4,591,220 | 5/1986 | Impey | 29/830 |
| 4,685,210 | 8/1987 | King et al. | 29/830 |
| 4,729,809 | 3/1988 | Dery et al. | 156/306.6 |
| 4,735,847 | 4/1988 | Fujiwara et al. | 428/209 |
| 4,814,040 | 3/1989 | Ozawa | 156/634 |
| 4,935,284 | 6/1990 | Puerner | 174/266 |
| 4,985,116 | 1/1991 | Mettler et al. | 156/656 |
| 5,004,672 | 4/1991 | D'Ottavio et al. | 430/314 |
| 5,032,896 | 7/1991 | Little et al. | 257/686 |
| 5,041,183 | 8/1991 | Nakamura et al. | 156/264 |
| 5,091,339 | 2/1992 | Carey | 438/623 |
| 5,128,831 | 7/1992 | Fox, III et al. | 361/396 |
| 5,225,966 | 7/1993 | Basavanhally et al. | 361/406 |
| 5,264,061 | 11/1993 | Juskey et al. | 156/214 |
| 5,274,912 | 1/1994 | Olenick et al. | 29/830 |
| 5,382,827 | 1/1995 | Wang et al. | 257/686 |
| 5,401,672 | 3/1995 | Kurtz et al. | 438/107 |
| 5,428,190 | 6/1995 | Stopperan | 174/261 |
| 5,552,633 | 9/1996 | Sharma | 257/686 |
| 5,579,207 | 11/1996 | Hayden et al. | 257/786 |

FOREIGN PATENT DOCUMENTS

| | | | |
|---|---|---|---|
| 33 16 017 | 11/1984 | Germany. | |
| 58-140144 | 8/1983 | Japan | 257/797 |
| 86 02518 | 4/1986 | WIPO. | |

OTHER PUBLICATIONS

Nov. 1994, vol. 18, No. 590 (E–1628).
Aug. 1996, 06 224531A JP (See Abstract).
Feb. 1996, vol. 96, No. 2, 29.
Oct. 1995, 07 263879A JP (See Abstract).
Nov. 1995, vol. 95, No. 10, 30.
Jul. 1995, 07 170077A mJP (See Abstract).

*Primary Examiner*—Alexander Oscar Williams
*Attorney, Agent, or Firm*—Joseph W. Malleck; Roger L. May

[57] ABSTRACT

A three-dimensional multi-layer molded electronic device and method for manufacturing same, wherein the device comprises at least two molded, three-dimensional substrates having mating surfaces, each substrate including a layer of patterned conductive material on at least one surface and electrically conductive vias at selected locations of the substrate for interconnection of the conductive layers, wherein the substrates are electrically joined at their mating surfaces and the circuit layers are aligned and interconnected to form a multi-layer, three-dimensional circuit which may include molded-in structural features.

16 Claims, 3 Drawing Sheets

THREE-DIMENSIONAL MULTI-LAYER MOLDED ELECTRONIC DEVICE AND METHOD FOR MANUFACTURING SAME

TECHNICAL FIELD

This invention relates to electrically conductive circuits which include a plurality of layers of conductive material fabricated on three-dimensional substrates and the interconnection of said layers to create a complex three-dimensional apparatus.

BACKGROUND ART

Electronic circuits are commonly manufactured by depositing conductive traces on insulative plastic substrates. Methods of fabricating circuits on three-dimensional (nonplanar) substrates including other molded-in structural features have also been developed. However, the process for producing the circuitry on three-dimensional surfaces has thus far been limited to one or two layer (i.e., one or both sides of a substrate) circuit designs.

DISCLOSURE OF INVENTION

One object of the present invention is to provide a multi-layer three-dimensional circuit including at least four interconnected layers of conductive material.

It is another object of the present invention to provide a multi-layer three-dimensional circuit including at least two molded three-dimensional substrates having a plurality of interconnected circuit layers, wherein each of the substrates includes integral three-dimensional structural features such as connectors, sockets, alignment pins, locating features, hinges, or housings.

In carrying out the above and other objects, the circuit of the present invention comprises at least two molded, three-dimensional substrates having mating surfaces, wherein each substrate includes a layer of patterned conductive material on at least one surface and electrically conductive vias which are preferably at selected locations of the substrate for interconnection of the conductive circuitry layers wherein the substrates are joined at their mating surfaces and the circuit layers are aligned and interconnected to form a multi-layer, three-dimensional circuit. In one embodiment, the electrically conductive vias are holes which are plated through, either during application of the patterned layer of conductive material to the substrate or in an additional step, to create plated-through holes ("PTHs") including interconnection pads. The interconnection pads are electrically connected via solder paste or other conductive adhesive, when the mating surfaces 20 and 22 of the substrates are aligned and joined.

In one embodiment, at least one additional circuit layer is fabricated and bonded between the mating surfaces of the substrates. The additional circuit layers each include a layer of patterned conductive material bonded to a layer of insulative material and electrically conductive vias at selected locations of the insulative layer for interconnection of the conductive layer to other conductive layers in the multi-layer circuit.

In a preferred embodiment, the mating surfaces of each of the three-dimensional substrates, as well as each of the additional circuit layers, are substantially planar. However, other embodiments employing rounded, angled, beveled, or otherwise non-planar mating surfaces, and similarly conformed additional circuit layers, may be employed without departing from the spirit of the invention.

Each of the three-dimensional substrates preferably includes integrated structural features such as connectors, sockets, etc., thereby providing a low-cost, three-dimensional part with state-of-the-art multi-layer electronic circuitry.

The objects, features, and advantages of the present invention are readily apparent from the following detailed description of the best mode for carrying out the invention when taken in connection with the accompanying drawings.

BEST MODE FOR CARRYING OUT THE INVENTION

Figure 1:
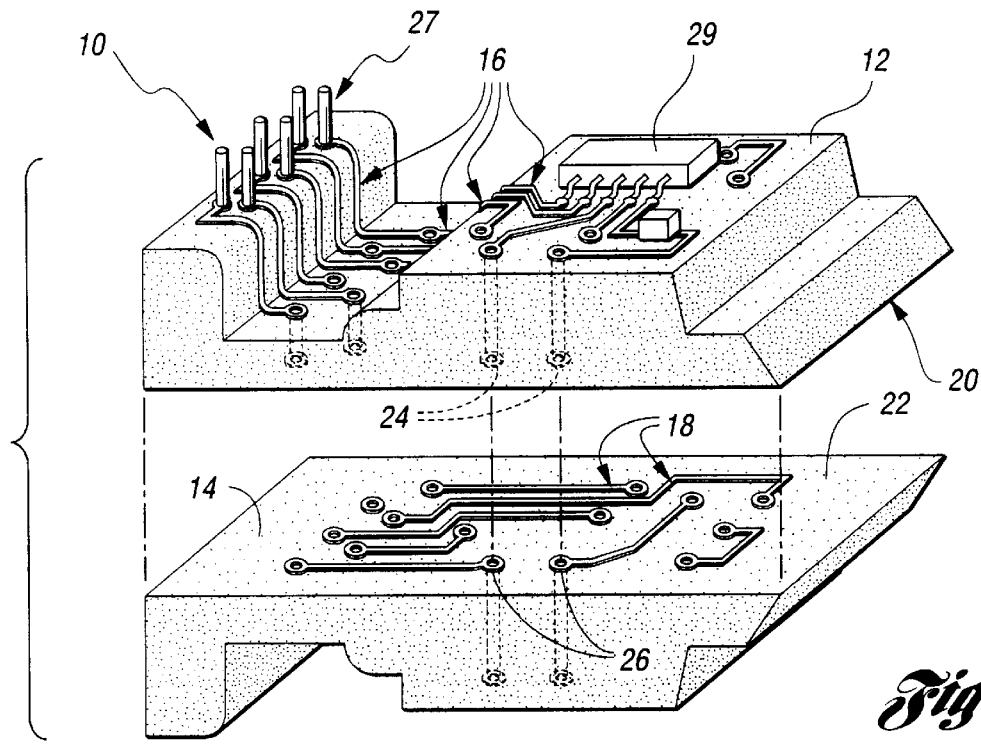
FIG. 1 is an exploded perspective view of one embodiment of the present invention.
Figure 2:
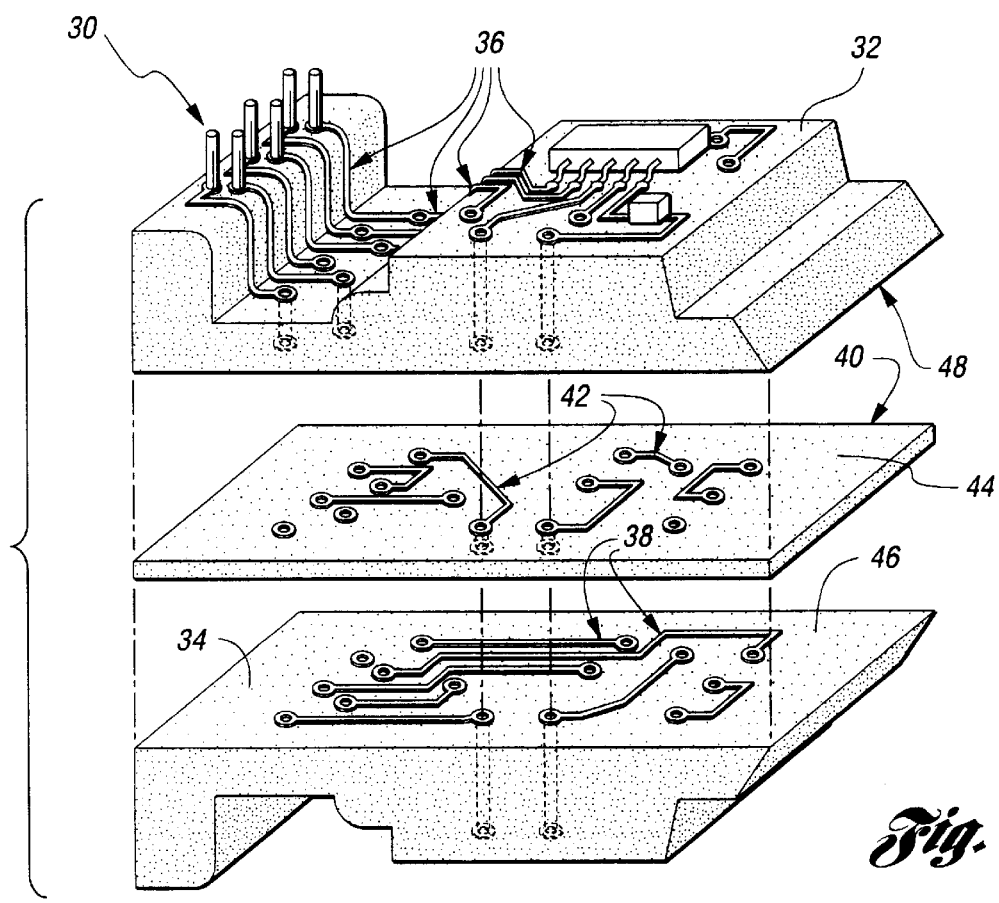
FIG. 2 is an exploded perspective view of a second embodiment of the present invention.

With reference to FIG. 1 of the drawings, a three-dimensional multi-layer circuit device of the present invention, generally indicated as 10, comprises a pair of three-dimensional molded substrates 12, 14, each including a layer of patterned conductive material 16, 18 on at least one surface. The substrates 12, 14 each include a mating surface 20, 22 at which the substrates 12 and 14 are joined together, and which provide the sites 24–26 for interconnection of the circuit layers. In the embodiment of FIGS. 1 and 2, the mating surfaces 20 and 22 are substantially planar. However, it will be appreciated that the mating surfaces may be non-planar (see FIG. 5) as long as sites are provided for reliable interconnection of the circuit layers, and provided the mating surfaces 20 and 22 allow for the substrates 12 and 14 to be securely joined together to form the completed device. The substrates 12, 14 are preferably a moldable insulative material, such as thermoset or, most preferably, a molded thermoplastic. Conductive materials may also be employed as the substrates, so long as the surfaces of the substrates are coated with a dielectric to effectively insulate the conductive circuitry that is subsequently applied to the substrates. The substrates are preferably formed by any of the known methods for fabricating three-dimensional molded parts, such as injection molding, blow molding, vacuum forming, etc.

The conductive material used for the circuitry (conductive traces) is typically metallic and preferably primarily copper, although any conductive material (such as conductive inks or metal foils) suitable for creating the conductive trace may be employed. The layer of conductive material may be applied by any of a number of known techniques including plating, printing, stencilling, embossing, or hot-stamping, so long as the desired conductive circuit is effectively applied to the insulative substrate.

Interconnection of circuit layers 16 and 18 may also be achieved using a variety of known techniques. Preferably, as previously described, holes are formed in the substrate at desired interconnection locations, and these holes are plated through when the conductive layer is applied to the substrate, thereby forming an electrically conductive via and interconnection pads on the mating surfaces at the selected locations. In one embodiment, these PTHs are interconnected by applying solder paste selectively to the interconnection pads, then heating the device in a conventional manner to allow the solder to melt and reform establishing the interconnection between the conductive surfaces, as well as effectively joining the substrates 12 and 14. Alternatively, the PTHs may be interconnected, and the substrates joined, by application of other commercially available conductive adhesives.

It will be appreciated that structural features may be molded into the substrates, such as a connector 27 (which may be subsequently plated).

Similarly, electronic components 29 may be subsequently mounted on the substrates 12 and 14 as desired. Other recesses and/or pockets (shown as 29, 31 in FIG. 3) may also be molded in to allow for mounting electronic devices and/or incorporating other structural components on any of the surfaces of the substrates.

It should also be appreciated that, while the embodiments illustrated in FIGS. 1 and 2 show the conductive circuits 16 and 18 on generally planar surfaces of the substrates 12 and 14, the layer of conductive material may be plated on a non-planar (i.e., three-dimensional) surface using known three-dimensional plating techniques.

Figure 3:
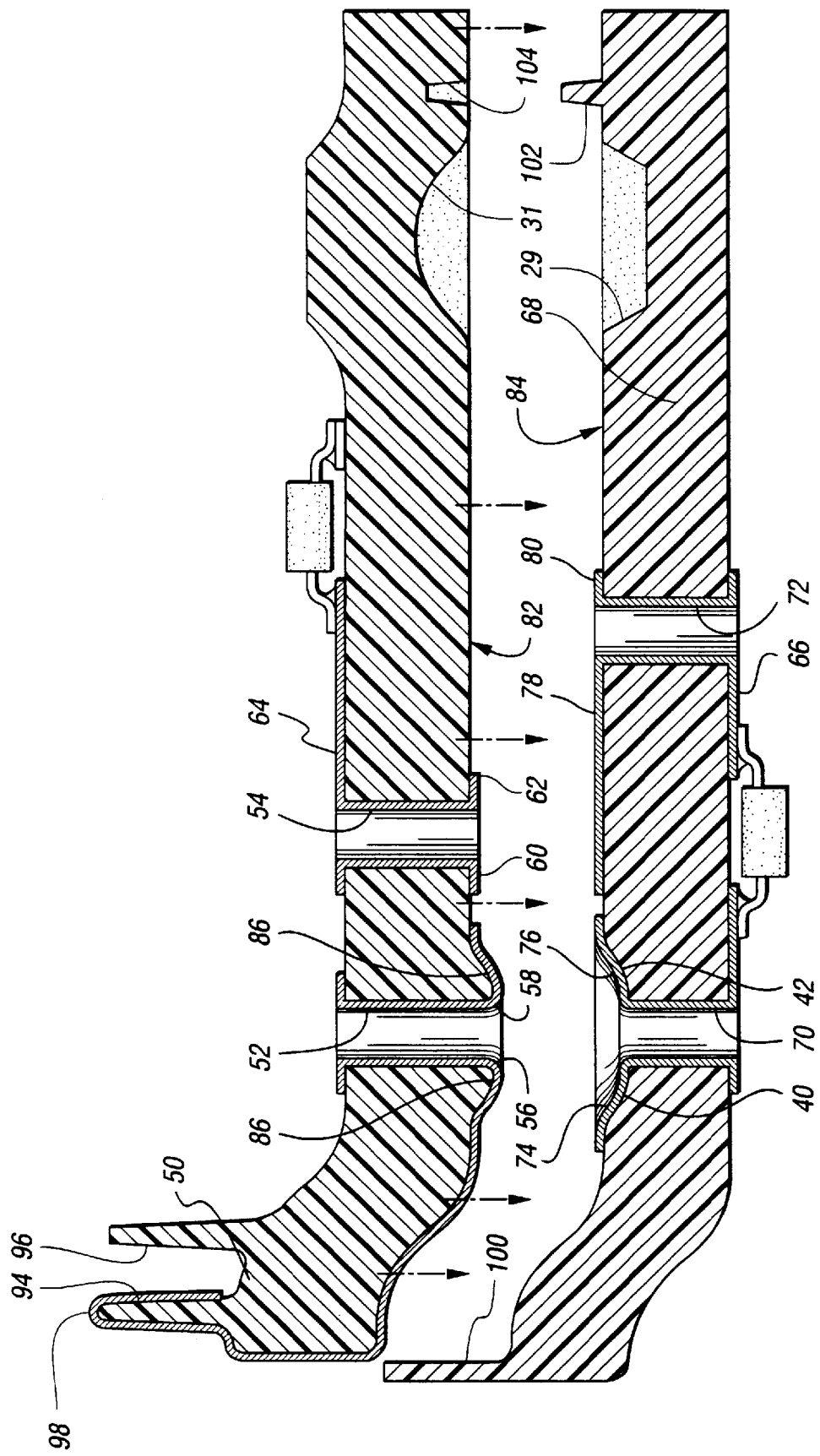
FIG. 3 is an exploded perspective view of a third embodiment of the present invention.

Referring to FIG. 3, an exemplary three-dimensional substrate 50 includes plated-through holes 52 and 54 which provide interconnection pads 56, 58, 60 and 62 for interconnection of conductive circuit 64 with conductive circuit 66 located on substrate 68. Substrate 68 includes plated-through holes 70 and 72, which similarly include interconnection pads 74, 76, 78, and 80 for this purpose. As previously described, the mating surfaces 82 and 84 of the substrates 50 and 68 may be joined and interconnected both mechanically and electrically by applying solder paste to interconnection pads 56, 58, 74 and 76, and, similarly, to interconnection pads 60, 62, and 78. It should be noted that three-dimensional features such as protrusions 86 and 88 and complimentary dimples 90 and 92 may be molded into the substrates to facilitate a better interconnection, as well as to facilitate easy registration of the substrates. Again, substrates 50 and 68 may be joined at the interconnection pads by application of conductive paste. Alternatively, or in addition, the substrates may be joined together by selectively applying adhesive at locations on the mating surfaces 82 and 84 other than interconnection sites. Other known interconnection techniques such as ultrasonic point welding, wire bonding, etc., may be employed to effect the interconnection of the layers 64 and 66. Alternatively, the layers may be interconnected by installing separate electrical interconnection components such as fuzz buttons or pin/socket joints.

It will be appreciated that structural features 94, 96 may be molded into a substrate and plated as desired (at 98) to provide a three-dimensional connector. Other molded-in three-dimensional features including registration face 100, and/or registration pin 102 and socket 104 may similarly be molded into the substrates to act as mechanical locating and locking features such as a snap-fit clip.

Referring to FIG. 2, an alternative embodiment 30 of the present invention comprises two three-dimensional substrates 32 and 34 each including conductive layers 36 and 38 on at least one of the surfaces of the substrates, and at least one additional circuit layer 40 including a layer of patterned conductive material 42 applied to an insulative material 44.

As with the embodiment of FIG. 1, electrically conductive vias are preferably formed in each of the substrates 32 and 34, as well as in the insulative layer 44 at selected locations for interconnection of the conductive layers 36, 38 and 42 as desired. The insulative layer 44 for the additional circuit 40 may be composed of a thermoset or other thermoplastic material similar to the molded substrates 32 and 34. Alternatively, the insulative layer 44 for any of the additional circuit layers may be known dielectric materials that are applied using photo imaging techniques, or any of a number of available dielectric films. The layer of conductive material 42 may be applied to the dielectric coating/film using conventional circuit building techniques, such as photo imaging or plating. The additional circuit layers could alternatively comprise multiple layers of thin printed wiring board ("PWB") or flex PWB which are stacked between the substrates 32 and 34, and interconnected as described herein.

The additional circuit 40 (and, where other additional circuits are desired, each of the additional circuits in a stacked vertical fashion) are properly aligned between the mating surfaces of the substrates 32 and 34 so that the conductive circuits on the substrates 32 and 34 and the additional circuit 40 may be interconnected, and the substrates 32, 34 and additional circuit layers 40 joined together to form a three-dimensional part including a complex multi-layer circuit. Again, the techniques for manufacturing the components of circuit 30 may be identical to those described above in connection with the embodiment of FIG. 1 except for the integration of additional circuit layers between the mating surfaces 46 and 48 of the substrates 32 and 34.

Figure 4:
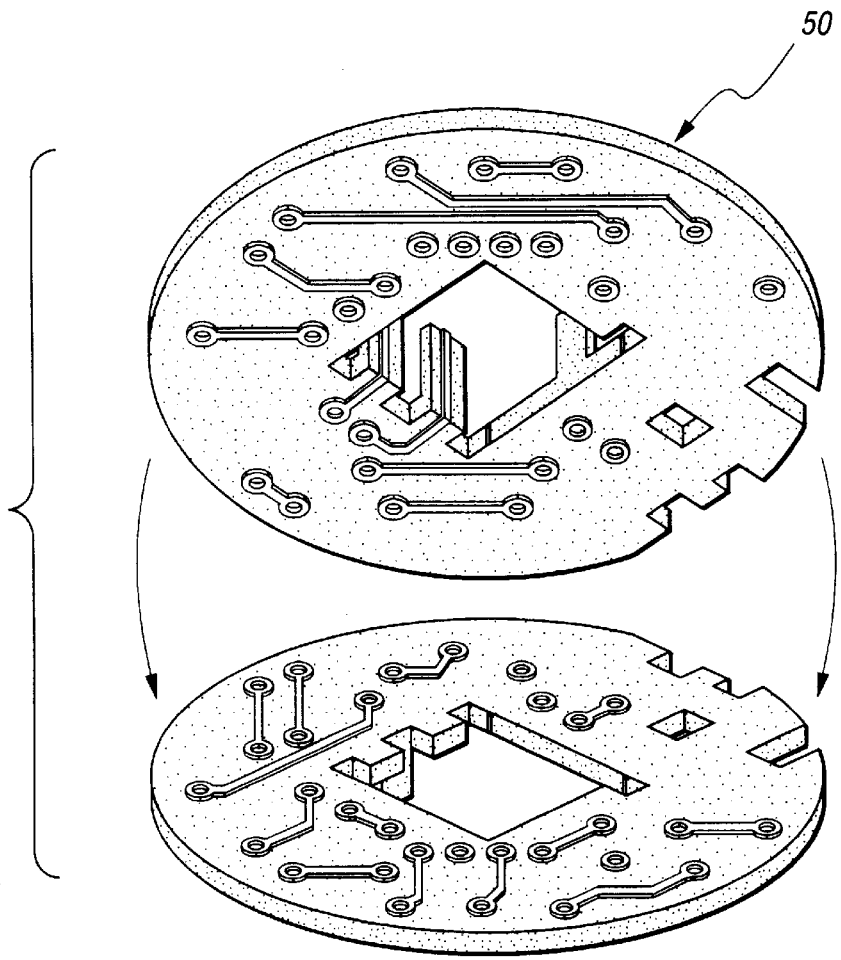
FIG. 4 is a perspective view of the embodiment of FIG. 3.
Figure 5:
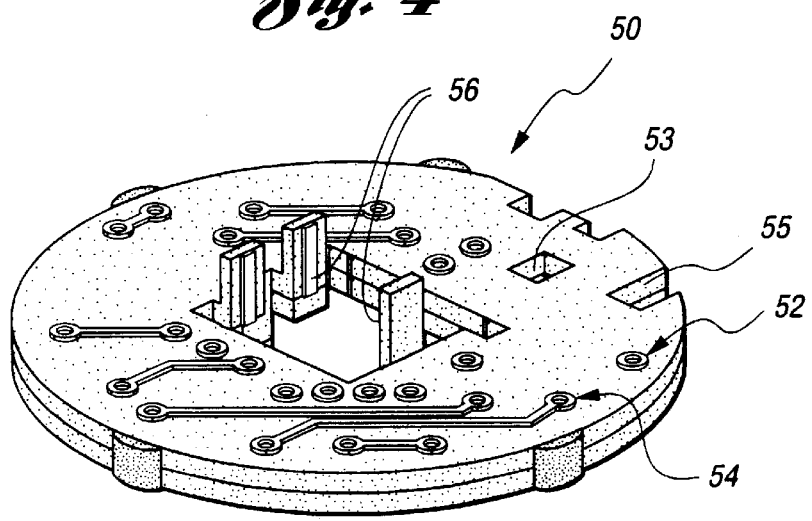
FIG. 5 is a partial angled view of an embodiment of the present invention illustrating the final assembly after the two layers had been mated together making the interconnections between circuit layers.

Referring now to FIGS. 4 and 5, another embodiment 50 of a three-dimensional circuit of the present invention is illustrated both in exploded view (FIG. 4) and as a completed part (FIG. 5). Though this embodiment is a molded interconnect device (MID), it will be appreciated that the substrates, as well as any additional circuit layers may be molded in a variety of shapes depending upon the intended application. In addition, molded-in features such as the notches 53, openings 55, and connectors 56 may be incorporated into this multi-layer circuit device inexpensively by using conventional molding techniques.

Thus, the present invention provides a complex three-dimensional part including a multi-layer electronic circuit. The molded substrates may be designed to include structural features relating to the parts application as well as three-dimensional features which relate to the electronics associated with the multi-layer circuits fabricated thereon, thereby achieving an inexpensive molded three-dimensional part including complex three-dimensional circuitry for dense electronic layouts.

While the best mode for carrying out the invention has been described in detail, those familiar with the art to which this invention relates will recognize various alternative designs and embodiments for practicing the invention as disclosed by the following claims.

What is claimed is:

1. A multi-layer, three-dimensional circuit comprising at least two molded three-dimensional substrates including at least one molded-in structural feature, each substrate including a mating surface and a layer of patterned conductive material on at least one surface wherein a portion of the layer of conductive material on at least one of the surfaces is on a non-planar surface, and electrically conductive vias at selected locations of the substrate for interconnection of the layers, wherein the layers of patterned conductive material are aligned and interconnected, and the substrates are joined together at the mating surfaces to form the multi-layer, three-dimensional device.

2. The circuit of claim 1 wherein the electrically conductive vias are plated-through holes and include interconnection pads on the mating surfaces of the substrates.

3. The circuit of claim 2 wherein the layers of patterned conductive material are interconnected by soldering the interconnection pads.

4. The circuit of claim 2 wherein the layers of patterned conductive material are interconnected by applying an adhesive paste to the interconnection pads.

5. The circuit of claim 2 wherein the layers of patterned conductive material are interconnected by applying an electrical interconnection component.

6. The circuit of claim 1 wherein the mating surfaces are substantially planar.

7. The circuit of claim 1 wherein the mating surfaces are non-planar.

8. The circuit of claim 1 including at least one additional circuit layer, the additional circuit layer including a layer of patterned conductive material adhered to a layer of insulative material, and electrically conductive vias at selected locations of the insulative layer for interconnection of the layer of conductive material to other layers of conductive material.

9. The circuit of claim 8 wherein the mating surfaces of the substrate and the additional circuit layers are substantially planar, and wherein the layer of conductive material on the additional circuit layers are aligned and interconnected and joined to the mating surfaces of the substrates by positioning the additional circuit layers between the mating surfaces of the substrates.

10. A new method of making a multi-layer three-dimensional circuit comprising:

providing at least one molded three-dimensional substrate including at least one molded-in structural feature;

applying a layer of conductive material in a selected pattern to at least one surface of the substrate, wherein a portion of the layer of conductive material on at least one of the surfaces is on a non-planar surface; and fabricating at least one additional circuit layer by applying a layer of insulative material to the substrate; defining vias at selected locations of the insulative layer for interconnection of the conductive layer to other conductive layers; and applying a layer of conductive material in a selected pattern on the layer of insulative material including interconnecting the conductive layers as desired by applying conductive material through the vias.

11. The circuit of claim 1 wherein at least one of the substrates includes a molded-in structural feature having a conductive coating to provide a three-dimensional connector.

12. The circuit of claim 1 wherein one of the substrates includes a molded-in pin and another of the substrates includes a molded-in socket, and wherein the pin and socket are located on their respective substrates so as to provide mechanical registration of the substrates when they are assembled.

13. The circuit of claim 12 wherein the registration pin and socket are shaped to provide a snap-fit lock between the assembled substrates.

14. The circuit of claim 1 wherein the mating surface of one of the substrates includes a molded-in protrusion, and the mating surface of another of the substrates includes a complimentary molded-in dimple to facilitate registration of the mating surfaces of the substrates.

15. The circuit of claim 14 wherein the molded-in protrusion and complimentary dimple are located at interconnection pads.

16. A multi-layer, three-dimensional circuit comprising:

at least two molded three-dimensional substrates with substantially planar mating surfaces, each substrate including a layer of patterned conductive material on at least one surface, wherein a portion of the layer of conductive material on at least one of the surfaces is on a non-planar surface, and electrically conductive vias at selected locations of the substrate for interconnection of the conductive layers;

at least one additional circuit layer including a layer of patterned conductive material adhered to a layer of insulative material, and electrically conductive vias at selected locations of the insulative layer for interconnection of the conductive layer to other conductive layers, wherein the circuits of the substrates and the additional circuit layers are aligned, interconnected and joined with the additional circuit layers between the mating surfaces of the substrates.

* * * * *